(12) United States Patent
Furman et al.

(10) Patent No.: US 8,164,192 B2
(45) Date of Patent: Apr. 24, 2012

(54) THERMO-COMPRESSION BONDED ELECTRICAL INTERCONNECT STRUCTURE

(75) Inventors: Bruce K. Furman, Poughquag, NY (US); Jae-Woong Nah, Closter, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/984,707

(22) Filed: Jan. 5, 2011

(65) Prior Publication Data

US 2011/0095431 A1   Apr. 28, 2011

Related U.S. Application Data

(62) Division of application No. 11/855,290, filed on Sep. 14, 2007, now Pat. No. 7,868,457.

(51) Int. Cl.
*H01L 25/488* (2006.01)
(52) U.S. Cl. ...................................... 257/762
(58) Field of Classification Search ........... 257/E23.021, 257/E23.069, E21.476, E23.026, E21.508, 257/41, 81, 82, 91, 99, 177–182, 276, 457, 257/459, 502, 503, 573, 584, 602, 621, 666, 257/677, 688–700, 734–786, E23.01–E23.079, 257/E23.141–E23.179, E23.02, E23.023; 174/255; 438/109, 118, 83, 98, 100–101, 438/111, 112, 123, 124, 411, 412, 461, 584, 438/597–688
See application file for complete search history.

(56) References Cited

U.S. PATENT DOCUMENTS

| | | | |
|---|---|---|---|
| 5,134,460 | A | 7/1992 | Brady et al. |
| 5,196,726 | A | 3/1993 | Nishiguchi et al. |
| 5,244,143 | A | 9/1993 | Ference et al. |
| 5,775,569 | A | 7/1998 | Berger et al. |
| 5,803,339 | A | 9/1998 | Hoshiba et al. |
| 6,105,852 | A | 8/2000 | Cordes et al. |
| 6,107,181 | A | 8/2000 | Kitajima et al. |
| 6,269,999 | B1 | 8/2001 | Okazaki et al. |
| 6,332,569 | B1 | 12/2001 | Cordes et al. |

(Continued)

FOREIGN PATENT DOCUMENTS

JP   05144888 A   6/1993

OTHER PUBLICATIONS

Jang et al.; Interfacial morphology and shear deformation of flip chip solder joints; J. Mater. Res., vol. 15, No. 8, Aug. 2000; pp. 1679-1687.

(Continued)

*Primary Examiner* — Dao H Nguyen
*Assistant Examiner* — Tram H Nguyen
(74) *Attorney, Agent, or Firm* — Schmeiser, Olsen & Watts; Daniel P. Morris

(57) ABSTRACT

An electrical structure and method for forming. The electrical structure includes a first substrate comprising a first electrically conductive pad, a second substrate comprising a second electrically conductive pad, and an interconnect structure electrically and mechanically connecting the first electrically conductive pad to the second electrically conductive pad. The interconnect structure comprises a non-solder metallic core structure and a first solder structure. The first solder structure electrically and mechanically connects a first portion of the non-solder metallic core structure to the first electrically conductive pad. A second portion of the non-solder metallic core structure is thermo-compression bonded to the second electrically conductive pad.

17 Claims, 14 Drawing Sheets

U.S. PATENT DOCUMENTS

| | | |
|---|---|---|
| 6,335,571 B1 | 1/2002 | Capote et al. |
| 6,458,622 B1 | 10/2002 | Keser et al. |
| 6,683,387 B1 | 1/2004 | Brownfield |
| 6,768,207 B2 | 7/2004 | Tao et al. |
| 7,087,458 B2 | 8/2006 | Wang et al. |
| 7,459,774 B2 | 12/2008 | Kwon et al. |
| 7,618,844 B2 | 11/2009 | Sheats |
| 7,651,021 B2 | 1/2010 | Supriya et al. |
| 7,868,457 B2 | 1/2011 | Furman et al. |
| 8,043,893 B2 | 10/2011 | Furman et al. |
| 2002/0132463 A1 | 9/2002 | Urushima |
| 2002/0171157 A1 | 11/2002 | Soga et al. |
| 2003/0038381 A1 | 2/2003 | Bolken |
| 2004/0110010 A1 | 6/2004 | Buchwalter et al. |
| 2005/0035453 A1* | 2/2005 | Ho et al. ............... 257/739 |
| 2006/0094228 A1 | 5/2006 | Li et al. |
| 2006/0177967 A1 | 8/2006 | Muto et al. |
| 2007/0018304 A1* | 1/2007 | Tellkamp et al. ........... 257/689 |
| 2007/0080451 A1* | 4/2007 | Suh ..................... 257/737 |
| 2008/0251281 A1* | 10/2008 | Buchwalter et al. ......... 174/255 |
| 2008/0284018 A1 | 11/2008 | Chainer |
| 2009/0075469 A1 | 3/2009 | Furman et al. |
| 2009/0288767 A1 | 11/2009 | Sakai et al. |
| 2010/0164086 A1 | 7/2010 | Noma et al. |
| 2010/0176510 A1* | 7/2010 | Pendse ..................... 257/737 |

OTHER PUBLICATIONS

D. R. Frear; Materials Issues in Area-Array Microelectronic Packaging; JOM; Mar. 1999; 51, 3; ABI/INFORM Trade & Industry; pp. 22-27.

K. N. Tu; Recent advances on electromigration in very-large-scale-integration of interconnects; Journal of Applied Physics, vol. 94, No. 9; Nov. 1, 2003; pp. 5451-5473.

Gruber et al.; Low-cost wafer bumping; IBM J. Res. & Dev., vol. 49, No. 4/5; Jul./Sep. 2005; pp. 621-639.

Feger et al.; A Wafer-level Underfill Process for Flip-chip Packaging; IMAPS 2002; Sep. 4-6, 2002, Denver, CO; 6 pages.

Notice of Allowance (Mail Date Sep. 2, 2010) for U.S. Appl. No. 11/855,290, filed Sep. 14, 2007.

Office Action (Mail Date Nov. 12, 2010) for U.S. Appl. No. 11/855,236, filed Sep. 14, 2007.

Final Office Action (Mail Date Apr. 13, 2011) for U.S. Appl. No. 11/855,236, filed Sep. 14, 2007.

Notice of Allowance (Mail Date Jun. 7, 2011) for U.S. Appl. No. 11/855,236, filed Sep. 14, 2007.

U.S. Appl. No. 13/159,773, filed Jun. 14, 2011.

* cited by examiner

THERMO-COMPRESSION BONDED ELECTRICAL INTERCONNECT STRUCTURE

This application is a divisional application claiming priority to Ser. No. 11/855,290, filed Sep. 14, 2007, now U.S. Pat. No. 7,868,457, issued Jan. 11, 2011.

FIELD OF THE INVENTION

The present invention relates to a thermo-compression bonded electrical interconnect structure and method for forming.

BACKGROUND OF THE INVENTION

Connections between structures are typically unreliable and subject to failure. Accordingly, there exists a need in the art to overcome at least one of the deficiencies and limitations described herein above.

SUMMARY OF THE INVENTION

The present invention provides an electrical structure comprising:
a first substrate comprising a first electrically conductive pad;
a second substrate comprising a second electrically conductive pad; and
an interconnect structure electrically and mechanically connecting said first electrically conductive pad to said second electrically conductive pad, wherein said interconnect structure comprises a non-solder metallic core structure and a first solder structure in direct mechanical contact with a first portion of said non-solder metallic core structure, wherein said first solder structure electrically and mechanically connects said first portion of said non-solder metallic core structure to said first electrically conductive pad, and wherein a second portion of said non-solder metallic core structure is thermo-compression bonded to said second electrically conductive pad.

The present invention advantageously provides a simple structure and associated method for forming connections between structures.

DETAILED DESCRIPTION OF THE INVENTION

Figure 1:
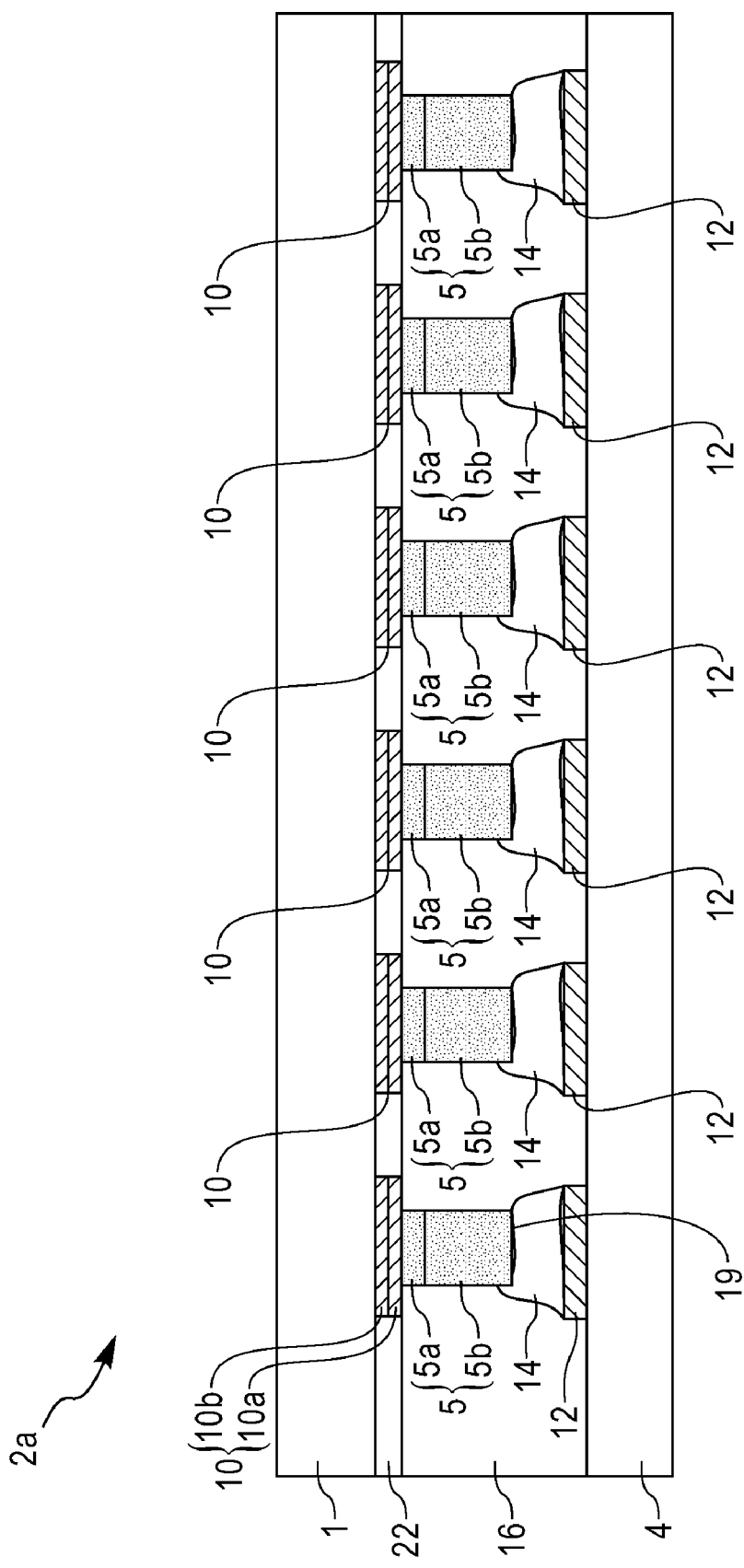
FIG. 1 illustrates a cross sectional view of an electrical structure, in accordance with embodiments of the present invention.

FIG. 1 illustrates a cross sectional view of an electrical structure 2a, in accordance with embodiments of the present invention. Electrical structure 2a comprises a substrate 1, a substrate 4, a plurality of interconnect structures 5, an optional layer of adhesive 22, and an optional layer(s) 16 of underfill encapsulant material. Substrate 1 comprises a plurality of electrically conductive pads 10. Each pad of electrically conductive pads 10 may be connected to wires or electrical components within substrate 1. Substrate 4 comprises a plurality of electrically conductive pads 12. Each pad of electrically conductive pads 12 may be connected to wires or electrical components within substrate 4. Substrate 1 may comprise, inter alia, a semiconductor device (e.g., an integrated circuit chip, a semiconductor wafer, etc), a chip carrier (organic or inorganic), a printed circuit board, etc. Substrate 4 may comprise, inter alia, a semiconductor device (e.g., an integrated circuit chip, a semiconductor wafer, etc), a chip carrier (organic or inorganic), a printed circuit board, etc. Each interconnect structure 5 comprises a non-solder metallic (i.e., does not comprise any solder material) core structure 5 and a solder structure 14. Solder structure 14 comprises solder. Solder is defined herein as a metal alloy comprising a low melting point (i.e., about 100 degrees Celsius to about 340 degrees Celsius) that is used to join metallic surfaces together without melting the metallic surfaces. Each solder structure 14 comprises a portion of solder electrically and mechanically connecting a bottom side 19 of non-solder metallic core structure 5 to electrically conductive pad 12. Each non-solder metallic core structure 14 may comprise any conductive metallic material that does not comprise solder including, inter alia, copper, gold, nickel, etc or any combination thereof. Each interconnect structure 5 comprises a first non-solder metallic structure 5a and a second non-solder metallic structure 5b electrically and mechanically connected to the first non-solder metallic structure 5a. First non-solder metallic structure 5a may comprise a first metallic material (e.g., gold) and second non-solder metallic structure 5b may comprise a second and different (i.e., from the first material) metallic material (e.g., copper). Alternatively, each interconnect structure 5 may comprise only a single non-solder metallic structure (e.g., all copper). Each interconnect structure 5 is thermo-compression bonded (i.e., a bond is formed by using a heating and pressure process in order to form a bond) to an associated electrically conductive pad 10. Each electrically conductive pad 10 may comprise a first material layer 10a (e.g., comprising a same material a comprised by first non-solder metallic structure 5a) formed over a second material layer 10b (e.g., comprising a same material a comprised by second non-solder metallic structure 5b). Additionally, each second material layer 10b may comprise a plurality of material layers such as, inter alia, titanium/copper, chromium/copper, titanium/nickel, vanadium/copper, etc. The thermo-compression bond is formed between first material layer 10a and first non-solder metallic structure 5a. Each interconnect structure 5 electrically and mechanically connects an electrically conductive pad 10 to an electrically conductive pad 12. Non-solder metallic core structure 5 comprises a cylindrical shape. Solder structure 14 may comprise any solder material suitable for a flip chip interconnections including, inter alia, an alloy of tin such as SnCu, SnAgCu, SnPb, etc. As an alternative, at least a first of non-solder metallic core structures 5 could be replaced by a solder structure such that at least one of electrically conductive pads 10 is connected to an associated electrically conductive pad 12 using a non-solder metallic core structure 5 and at least another of electrically conductive pads 10 is connected to an associated electrically conductive pad 12 using a solder structure.

Figure 2:
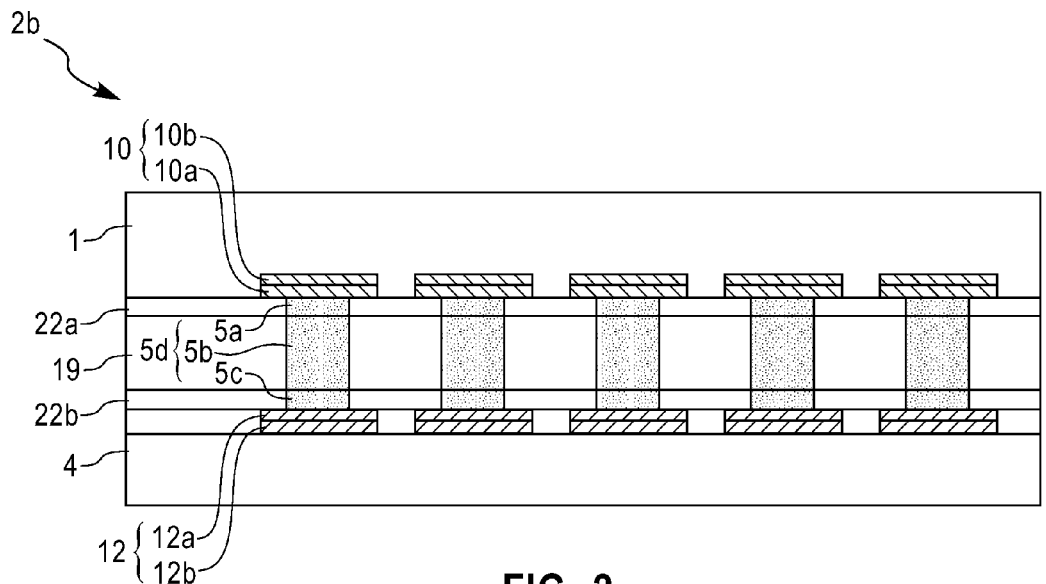
FIG. 2 depicts a first alternative to FIG. 1, in accordance with embodiments of the present invention.

FIG. 2 depicts a first alternative to FIG. 1 illustrating a cross-sectional view of an electrical structure 2b, in accordance with embodiments of the present invention. In contrast with electrical structure 2a of FIG. 1, electrical structure 2b of FIG. 2 each interconnect structure 5d is thermo-compression bonded (i.e., a bond is formed by using a heating and pressure process in order to form a bond) to an associated electrically conductive pad 12 instead of soldered. Each interconnect structure 5d comprises a first non-solder metallic structure 5a, a second non-solder metallic structure 5b electrically and mechanically connected to the first non-solder metallic structure 5a, and a third non-solder metallic structure 5c electrically and mechanically connected to the second non-solder metallic structure 5b. First non-solder metallic structure 5a and third non-solder metallic structure 5a may comprise a first metallic material (e.g., gold) and second non-solder metallic structure 5b may comprise a second and different (i.e., from the first material) metallic material (e.g., copper). Alternatively, each interconnect structure 5d may comprise only a single non-solder metallic structure (e.g., copper). Each electrically conductive pad 12 may comprise a first material layer 12a (e.g., comprising a same material a comprised by third non-solder metallic structure 5c) formed over a second material layer 12b (e.g., comprising a same material a comprised by second non-solder metallic structure 5b). The thermo-compression bond is formed between first material layer 12a and third non-solder metallic structure 5c. Each interconnect structure 5c electrically and mechanically connects an electrically conductive pad 10 to an electrically conductive pad 12.

Figure 3:
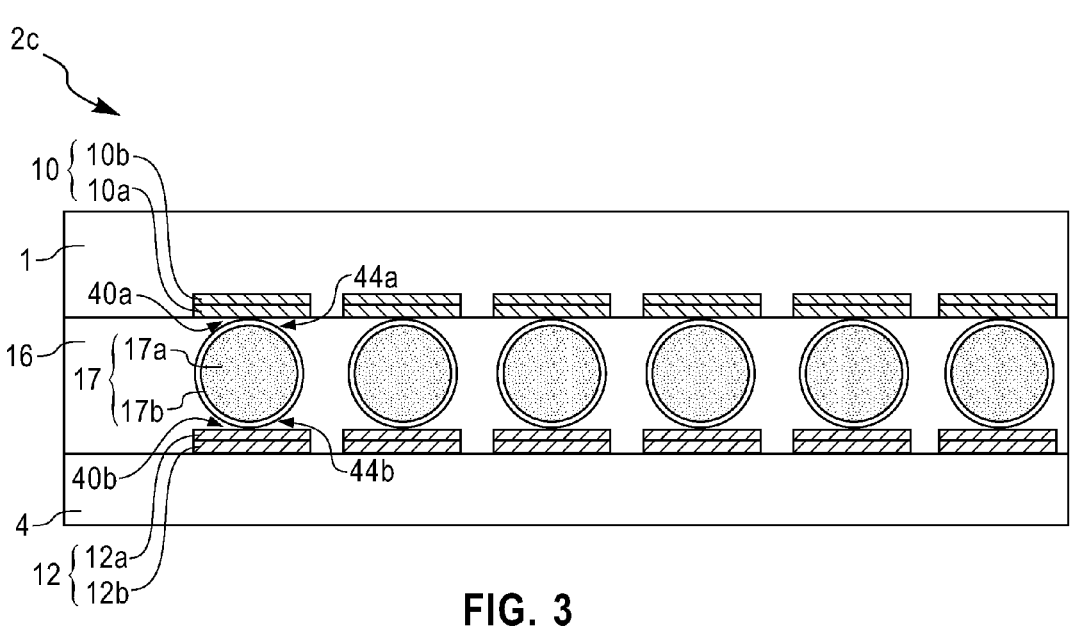
FIG. 3 depicts a first alternative to FIG. 2, in accordance with embodiments of the present invention.

FIG. 3 depicts a first alternative to FIG. 2 illustrating a cross-sectional view of an electrical structure 2C, in accordance with embodiments of the present invention. Electrical structure 2C may comprise an optional layer(s) 16 of underfill encapsulant material. In contrast with electrical structure 2B of FIG. 2, electrical structure 2C of FIG. 3 comprises a plurality of spherical interconnect structures 17 comprising a spherical non-solder (i.e., does not comprise any solder material) metallic core structure 17. Each non-solder (i.e., does not comprise any solder material) metallic core structure 17 comprises a non solder metallic layer 17b (i.e., comprising a first metallic material such as, inter alia, gold) that completely surrounds an exterior surface of an associated non-solder metallic core 17a (i.e., comprising a second metallic material such as, inter alia, copper). Each non solder metallic layer 17b may comprise, inter alia, copper, gold, nickel, etc. Each non-solder metallic core 17a may comprise, inter alia, copper, gold, nickel, etc. Alternatively, each non-solder metallic core structure 17 may comprise a single non-solder metallic material such as, inter alia, copper. Each interconnect structure 17 comprises a first portion 44a thermo-compression bonded (i.e., comprising a thermo-compression bond 40a) to electrically conductive pad 10 and a second portion 44b thermo-compression bonded (i.e., comprising a thermo-compression bond 40b) to electrically conductive pad 12 thereby electrically and mechanically connecting electrically conductive pad 10 to electrically conductive pad 12. For first level area array interconnects, each non-solder metallic core structure 17 may comprise a diameter of about 25 microns to about 150 microns. For second level area array interconnects (e.g., a ball grid array (BGA)), each non-solder metallic core structure 17 may comprise a diameter of about 0.2 mm to about 1.5 mm. Each non-solder metallic core structure 17 may comprise a core of any conductive metallic material that does not comprise solder including, inter alia, copper, gold, nickel, etc. Additionally, each non-solder metallic core structure 17 may comprise an additional layer(s) of non-solder metallic materials (i.e., different from a material comprised by non-solder metallic core structure 17) surrounding (e.g., see layer 19 in FIG. 3, infra) non-solder metallic core structure 17. The additional layer(s) may comprise any conductive metallic material including, inter alia, nickel, gold, tin, etc.

Figure 4:
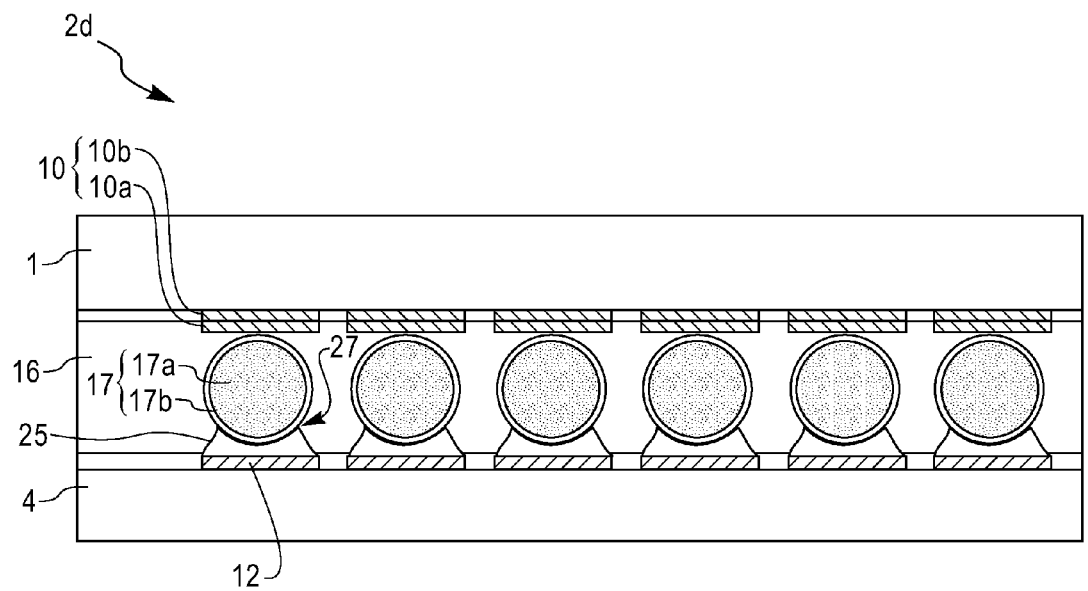
FIG. 4 depicts a first alternative to FIG. 3, in accordance with embodiments of the present invention.

FIG. 4 depicts a first alternative to FIG. 3 illustrating a cross-sectional view of an electrical structure 2D, in accordance with embodiments of the present invention. In contrast with electrical structure 2C of FIG. 3, electrical structure 2D of FIG. 3 comprises solder structures 25. Solder structure 25 comprises solder. Solder is defined herein as a metal alloy comprising a low melting point (i.e., about 100 degrees Celsius to about 340 degrees Celsius) that is used to join metallic surfaces together without melting the metallic surfaces. Each solder structure 25 comprises a portion of solder electrically and mechanically connecting a portion 27 of non-solder metallic core structure 17 to an associated electrically conductive pad 12. As an alternative, at least a first of non-solder metallic core structures 17 could be replaced by a solder structure such that at least one of electrically conductive pads 10 is connected to an associated electrically conductive pad 12 using a non-solder metallic core structure 17 and at least another of electrically conductive pads 10 is connected to an associated electrically conductive pad 12 using a solder structure.

Figure 5A:
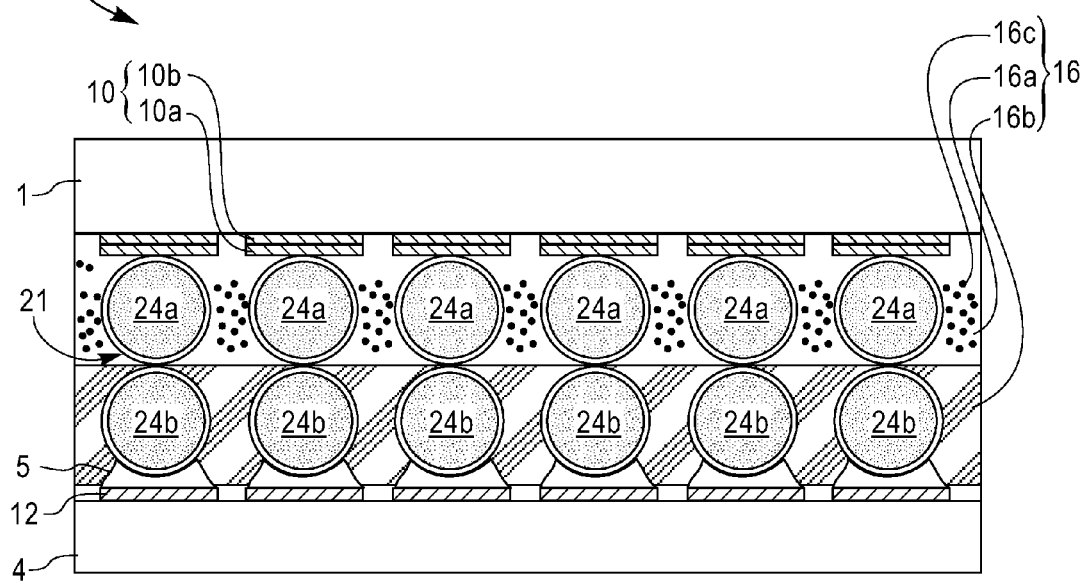
FIG. 5A depicts a first alternative to FIG. 4, in accordance with embodiments of the present invention.

FIG. 5A depicts a first alternative to FIG. 4 illustrating a cross-sectional view of an electrical structure 2E, in accordance with embodiments of the present invention. In contrast with electrical structure 2D of FIG. 4, electrical structure 2E of FIG. 5A comprises a plurality of interconnect structures 21. Each of interconnect structures 21 comprises a non-solder metallic core structure 24a, a non-solder metallic core structure 24b, and solder structure 5. Additionally (i.e., optionally), electrical structure 2E comprises an underfill encapsulant layer 16 comprising a first underfill encapsulant layer 16a and a second underfill encapsulant layer 16b. Alternatively, underfill encapsulant layer 16 may consist of only a single encapsulant layer. Each non-solder metallic core structure 24a is thermo-compression bonded to an associated electrically conductive pad 10. Each non-solder metallic core structure 24a is thermo-compression bonded to an associated non-solder metallic core structure 24b resulting in an electrical and mechanical connection between each non-solder metallic core structure 24a to an associated a non-solder metallic core structure 24b. Each solder structure 5 electrically and mechanically connects a non-solder metallic core structure 24b to an associated electrically conductive pad 12. The aforementioned connections result in each interconnect structure 21 electrically and mechanically connecting an electrically conductive pad 10 to an associated electrically conductive pad 12. As with each non-solder metallic core structure 17 of FIG. 3, each non-solder metallic core structure 24a and 24b of FIG. 5A may comprise a first metallic material such as, inter alia, gold that completely surrounds an exterior surface of a core comprising a second non-solder metallic material such as, inter alia, copper. Additionally, each non-solder metallic core structure 21a and 21b may comprise an additional layer(s) of metallic materials surrounding non-solder metallic core structure 24a and 24b. Additional layer(s) may comprise any conductive metallic material including, inter alia, nickel, gold, tin, etc. Underfill encapsulant layer 16a surrounds non-solder metallic core structures 21a and is in contact with substrate 1. Underfill encapsulant layer 16b surrounds non-solder metallic core structures 21b and is in contact with substrate 4. Underfill encapsulant layer 16a is in contact with underfill encapsulant layer 16b. Underfill encapsulant layer 16a may comprise a first material (e.g., a highly filled silica-epoxy composite adhesive) and underfill encapsulant layer 16b may comprise a second and different material (e.g., a lightly filled silica-epoxy composite adhesive). Underfill encapsulant layer 16a may comprise a first coefficient of thermal expansion (e.g., comprising a range of about 5-15 ppm/C) that is different (e.g., lower) from a second coefficient of thermal expansion (e.g., comprising a range of about 15-40 ppm/C) comprised by encapsulant layer 16b. Underfill encapsulent layer 16a may additionally comprise a filler 16c dispersed throughout.

Figure 5B:
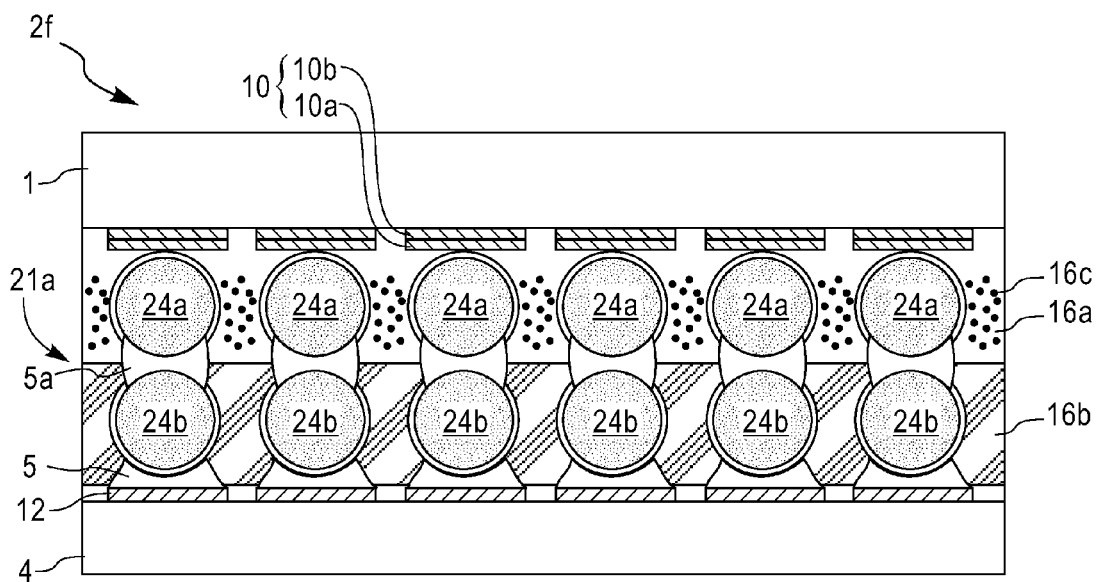
FIG. 5B depicts a first alternative to FIG. 5A, in accordance with embodiments of the present invention.

FIG. 5B depicts a first alternative to FIG. 5A illustrating a cross-sectional view of an electrical structure 2F, in accordance with embodiments of the present invention. In contrast with electrical structure 2E of FIG. 5A, electrical structure 2F of FIG. 5B comprises interconnect structures 21a comprising a plurality of solder structures 5a electrically and mechanically connecting each non-solder metallic core structure 24a to an associated non-solder metallic core structure 24b.

Figure 6A:
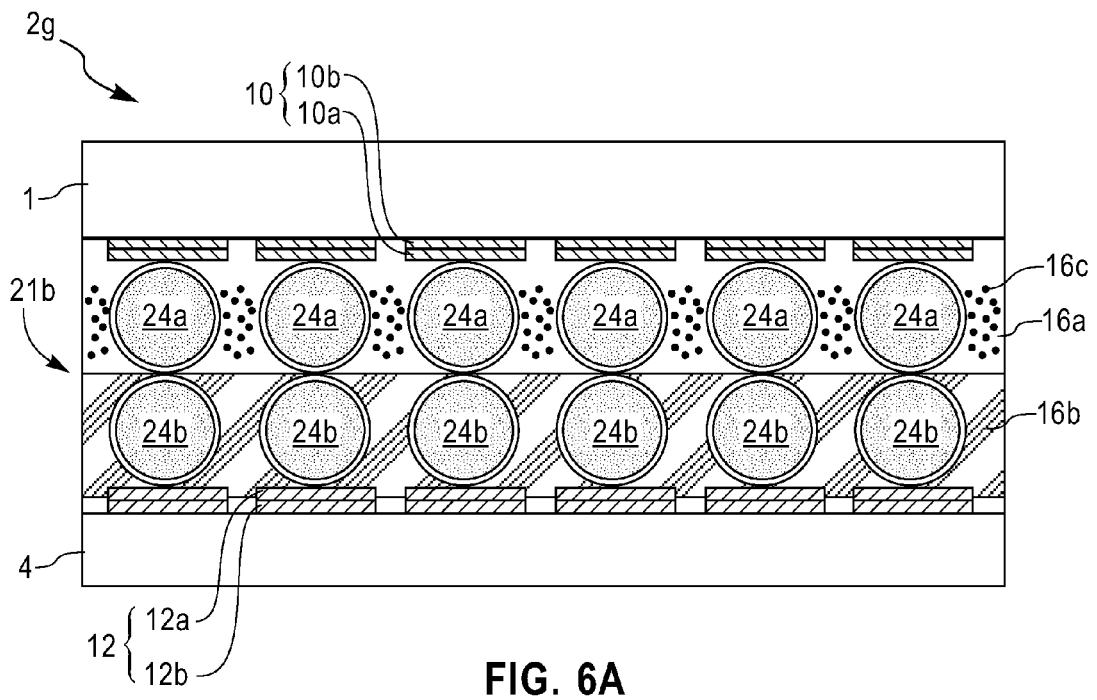
FIG. 6A depicts a second alternative to FIG. 5A, in accordance with embodiments of the present invention.

FIG. 6A depicts a second alternative to FIG. 5A illustrating a cross-sectional view of an electrical structure 2G, in accordance with embodiments of the present invention. In contrast with electrical structure 2E of FIG. 5A, electrical structure 2G of FIG. 6A comprises interconnect structures 21b wherein each non-solder metallic core structure 24a of electrical structure 2G is thermo-compression bonded to an associated electrically conductive pad 12.

Figure 6B:
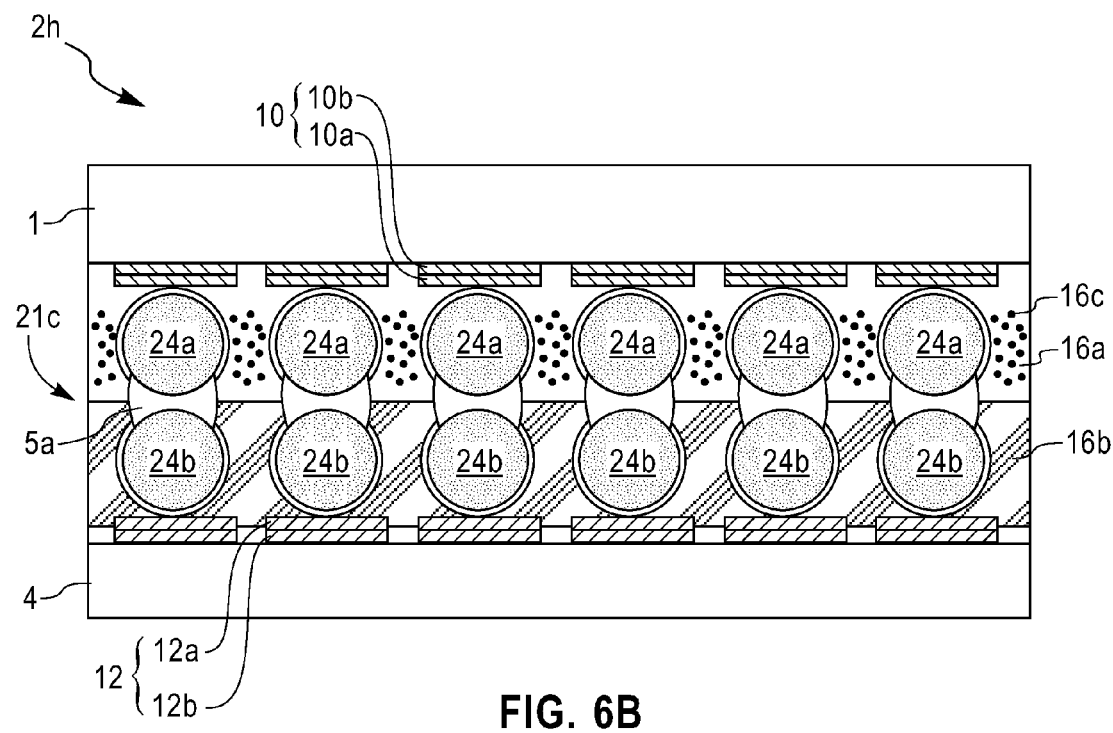
FIG. 6B depicts a first alternative to FIG. 6A, in accordance with embodiments of the present invention

FIG. 6B depicts a first alternative to FIG. 6A illustrating a cross-sectional view of an electrical structure 2H, in accordance with embodiments of the present invention. In contrast with electrical structure 2G of FIG. 6A, electrical structure 2H of FIG. 6B comprises interconnect structures 21c comprising a plurality of solder structures 5a electrically and mechanically connecting each non-solder metallic core structure 24a to an associated non-solder metallic core structure 24b.

FIGS. 7A-7G illustrate a process for generating electrical structure 2C of FIG. 3 and/or electrical structure 2D of FIG. 4, in accordance with embodiments of the present invention.

Figure 7A:
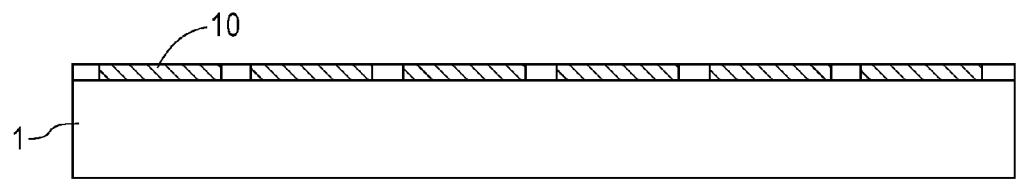
FIGS. 7A-7H illustrate a process for generating the electrical structure 2C of FIG. 3

FIG. 7A illustrates a cross sectional view of substrate 1, in accordance with embodiments of the present invention. Substrate 1 comprises electrically conductive pads 10.

Figure 7B:
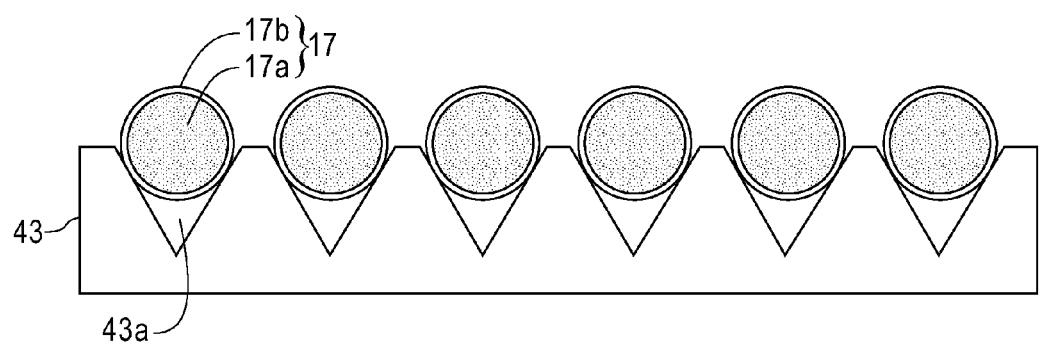

FIG. 7B illustrates a cross sectional view of a transfer substrate 43 comprising a plurality of non-solder metallic core structures 17a, in accordance with embodiments of the present invention. Non-solder metallic core structures 17 are positioned in cavities 43a within transfer substrate 43. Each of cavities 43a comprises similar dimensions as non-solder metallic core structures 17 with cavity positions corresponding to positions of associated electrically conductive pads 10 (i.e., from FIG. 7A). Transfer substrate 43 may comprise, inter alia, glass, silicon, etc. Non-solder metallic core structures 17 may be dispensed into cavities 43a as a slurry in a solvent such as, inter alia, water alcohol (e.g., isopropanol), etc. The solvent may comprise an appropriate amount of flux (i.e., if generating structure 2D of FIG. 4) to assist in the wetting of solder structures 25 (of FIG. 4) to non-solder metallic core structures 17a. In a case in which non-solder metallic core structures 17a are coated with a gold layer 17b, flux is not necessary. Optionally, the solvent may additionally comprise a small amount of thermally degradable polymeric adhesive to aid in retaining non-solder metallic core structures 17a in cavities 43a. Cavities 43a are fabricated to a size that will only cause one non-solder metallic core structure 17a to fall into it during a dispensing of non-solder metallic core structures 17a.

Figure 7C:
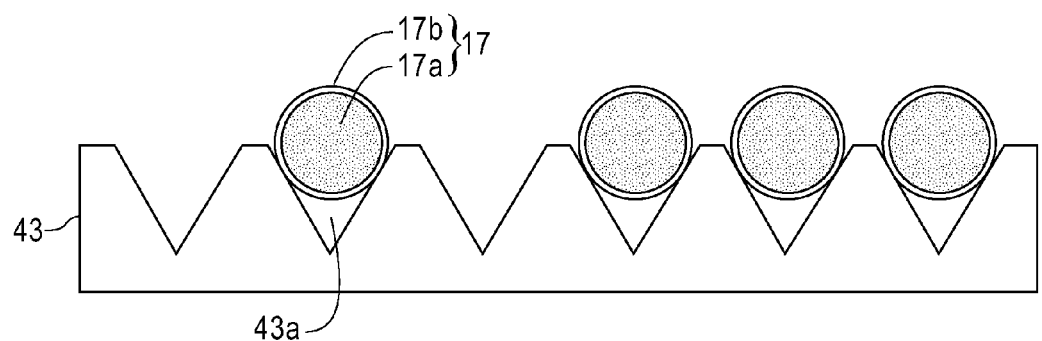
Figure 7D:
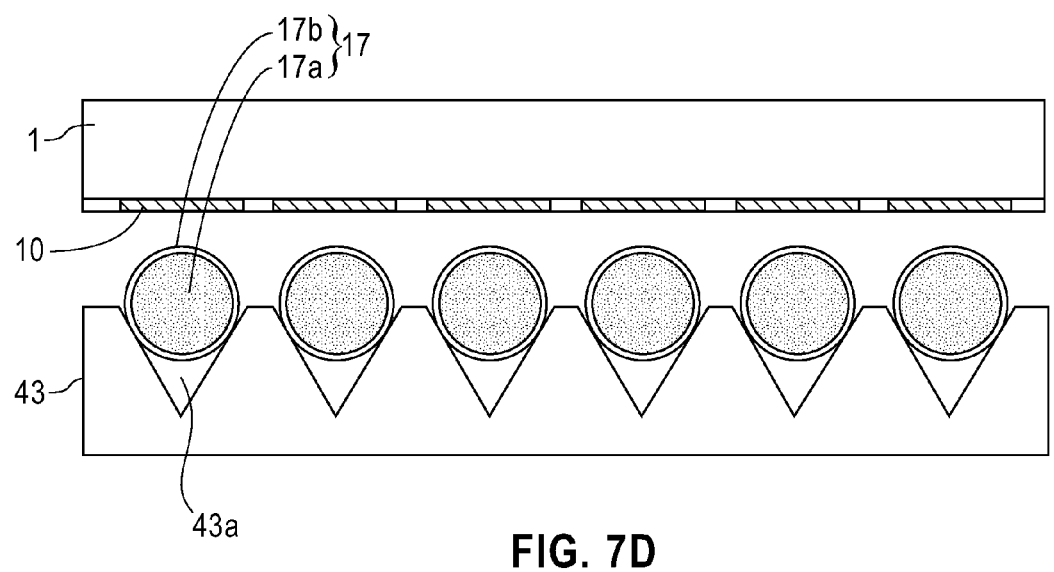

FIG. 7C illustrates a cross sectional view of transfer substrate 43 of FIG. 7D comprising a selected plurality of non-solder metallic core structures 17a, in accordance with embodiments of the present invention. As an optional feature of the process, transfer substrate 43 may be covered with a polymeric film (i.e., not shown) with through-holes matching a pre-determined fraction of cavities 43a. The pre-determined fraction of cavities 43a covered by the polymeric film will be prevented from receiving non-solder metallic core structures 17a. The pre-determined fraction of cavities 43a allows a packaging design engineer to selectively place non-solder metallic core structures 17a. Additionally, solder interconnects or any other type of interconnect (i.e., not shown) may be selectively placed in some of cavities 43a (i.e., instead of select non-solder metallic core structures 17) for placement on substrate 1. In this option, transfer substrate 43 may be covered with a second polymeric film (i.e., not shown) with through-holes matching the remaining cavities 43a. The cavities 43a covered by the polymeric film will be prevented from receiving solder interconnects.

FIG. 7D illustrates a cross sectional view of substrate 1 of FIG. 7A positioned over transfer substrate 43 comprising non-solder metallic core structures 17a, in accordance with embodiments of the present invention. Substrate 1 of FIG. 7A is positioned over transfer substrate 43 comprising non-solder metallic core structures 17a in order to transfer non-solder metallic core structures 17a to substrate 1.

Figure 7E:
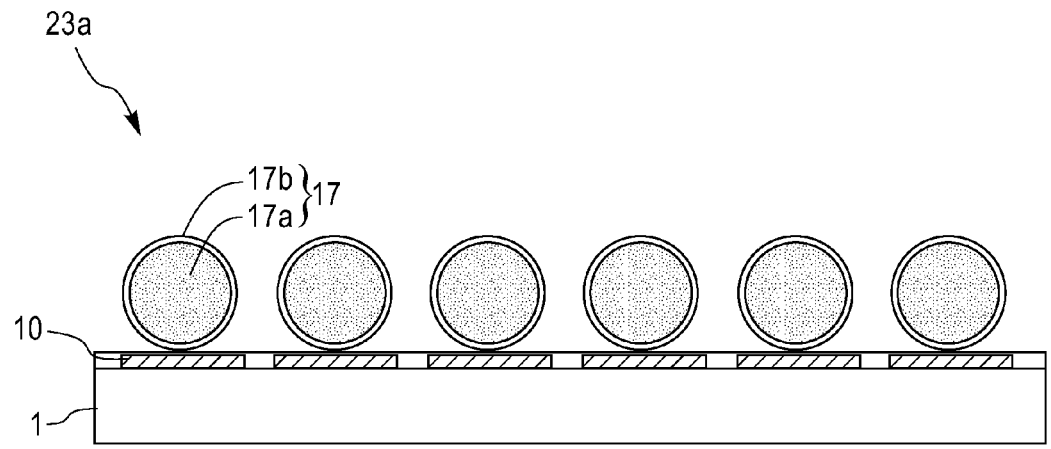

FIG. 7E illustrates a cross sectional view of a structure 23a comprising substrate 1 after non-solder metallic core structures 17a have been released from transfer substrate 43 and thermo-compression bonded to electrically conductive pads 10, in accordance with embodiments of the present invention.

Figure 7F:
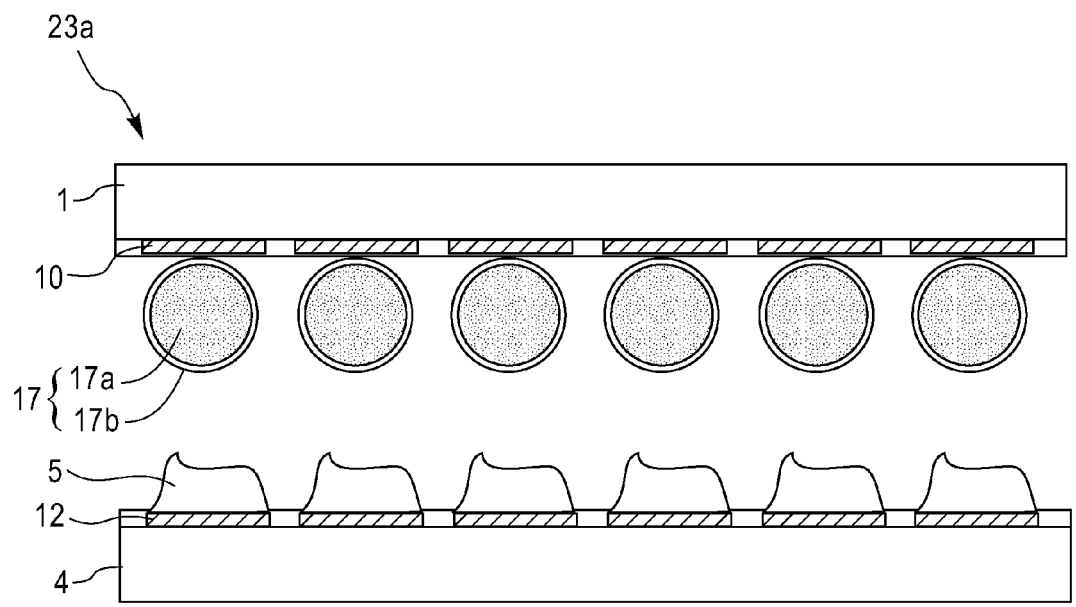

FIG. 7F illustrates a cross sectional view of structure 23a positioned over substrate 4 comprising solder structures 25 of FIG. 4, in accordance with embodiments of the present invention. Structure 23a is positioned over substrate 4 comprising solder structures 25 in order to form structure 2D of FIG. 4. Structure 2D of FIG. 4 comprises thermo-compression bonds to electrically conductive pads 10 on substrate 1 and solder connections to electrically conductive pads 12 on substrate 4.

Figure 7G:
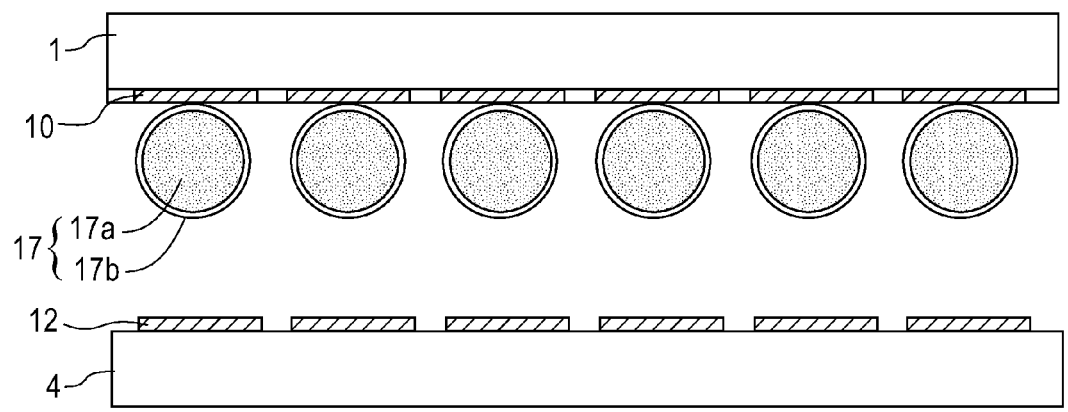

FIG. 7G depicts an alternative to FIG. 7F illustrating a cross sectional view of structure 23a positioned over substrate 4 of FIG. 3, in accordance with embodiments of the present invention. Structure 23a is positioned over substrate 4 in order to form structure 2C of FIG. 3. Structure 2C of FIG. 3 comprises thermo-compression bonds to electrically conductive pads 10 on substrate 1 and electrically conductive pads 12 on substrate 4.

Figure 7H:
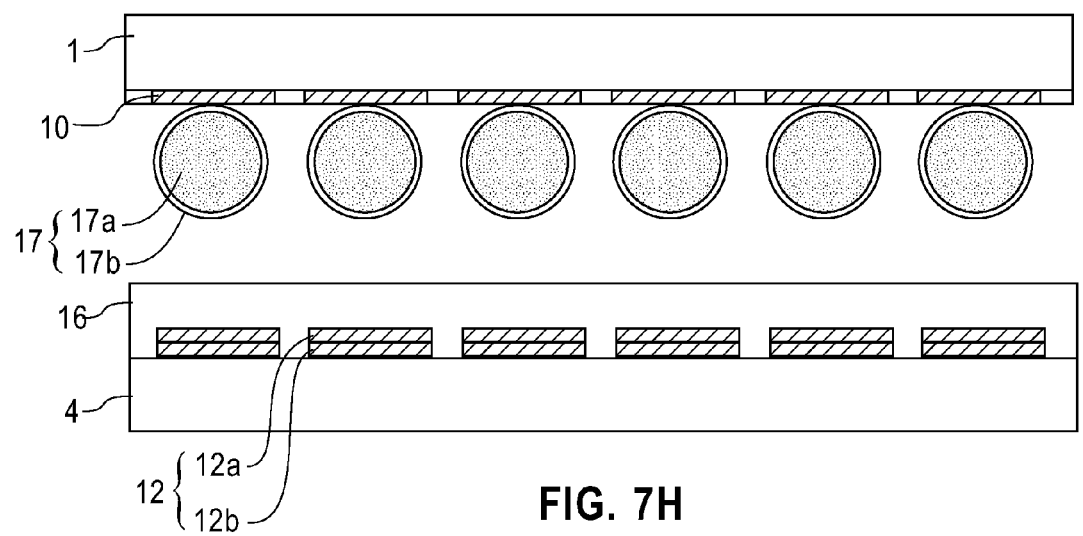

FIG. 7H depicts an alternative to FIG. 7G illustrating a cross sectional view of structure 23a positioned over substrate 4 of FIG. 3, in accordance with embodiments of the present invention. In contrast with FIG. 7G, FIG. 7H illustrates optional underfill encapsulant layer 16.

FIGS. 8A-8E illustrate a process for generating electrical structure 2A of FIG. 1 and/or electrical structure 2B of FIG. 2, in accordance with embodiments of the present invention.

Figure 8A:
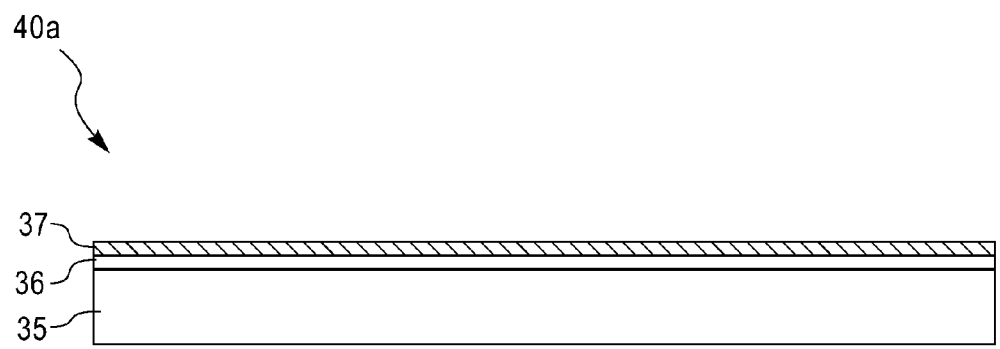
FIGS. 8A-8E illustrate a process for generating the electrical structure of FIG. 1 and/or the electrical structure of FIG. 2, in accordance with embodiments of the present invention.

FIG. 8A illustrates a cross sectional view of a structure 40a comprising a sacrificial carrier substrate 35, a release layer 36, and a seed layer 37, in accordance with embodiments of the present invention. Sacrificial carrier substrate 35 may comprise any substrate material including, inter alia, silicon, glass, etc. In order to form structure 40a, seed layer 37 (e.g., a blanket polymer layer such as, inter alia, a polyimide release layer) is applied to sacrificial carrier substrate 35 and a seed layer 37 (e.g., copper, chromium, etc.) is applied over release layer 36. A photo resist layer (i.e., not shown) may be applied over seed layer 37. The photo resist layer is patterned to form interconnect structures 5 in FIG. 8B. A width for each of interconnect structures selected from a range of about of 10-100 microns with an aspect ratio selected from a range of about 1:1 to 5:1. Interconnect structures 5 may be formed by electroplating of vapor deposition and subsequent chemical/mechanical polishing to insure a flat topography. Alternatively interconnect structures 5 may be formed by a subtractive etch process in which a thick (e.g., 50-100 um) copper layer is applied to seed layer 37 by plating or bonding. The Copper layer would then be coated with photo resist, exposed with an I/O pattern, and subtractive etched down to release layer 36. After removal of the photo resist, interconnect structures 5 may be filled with dielectric or under fill adhesive. A surface of interconnect structures 5 is then planerized in such a way to allow 0.1-1 um of copper protruding above a surface of underfill layer 16 of FIG. 8B. The Copper surface may be bonded directly to electrically conductive pads 10 (see FIG. 8C) or a thin Au or Ni/Au layer 5a may be added to improve interconnect properties.

Figure 8B:
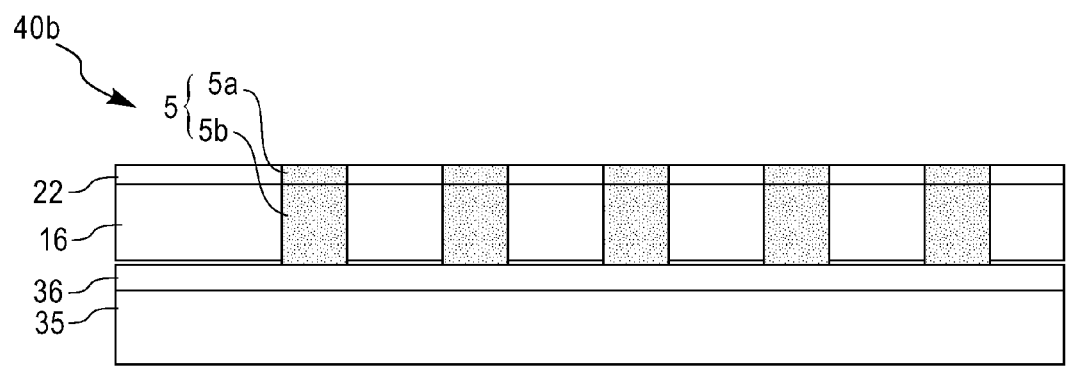

FIG. 8B illustrates a cross sectional view of a structure 40b, in accordance with embodiments of the present invention. Structure 40b has been formed from structure 40 of FIG. 8A.

Figure 8C:
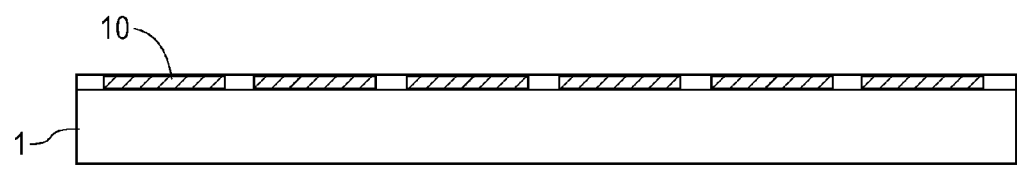

FIG. 8C illustrates a cross sectional view of substrate 1, in accordance with embodiments of the present invention. Substrate 1 comprises electrically conductive pads 10.

Figure 8D:
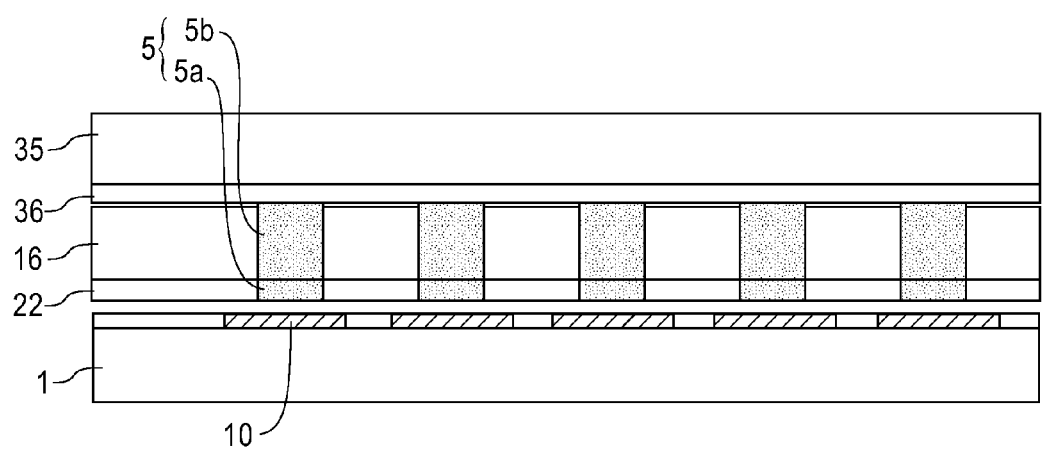

FIG. 8D illustrates a cross sectional view of structure 40b of FIG. 8B aligned over substrate 1 of FIG. 8C, in accordance with embodiments of the present invention. Structure 40b is aligned over substrate 1 so that interconnect structures may be thermo-compression bonded to electrically conductive pads 10 in order to form structure 40C of FIG. 8E. The alignment may be performed using bonding tools by direct viewing through the carrier via infrared or visible light.

Figure 8E:
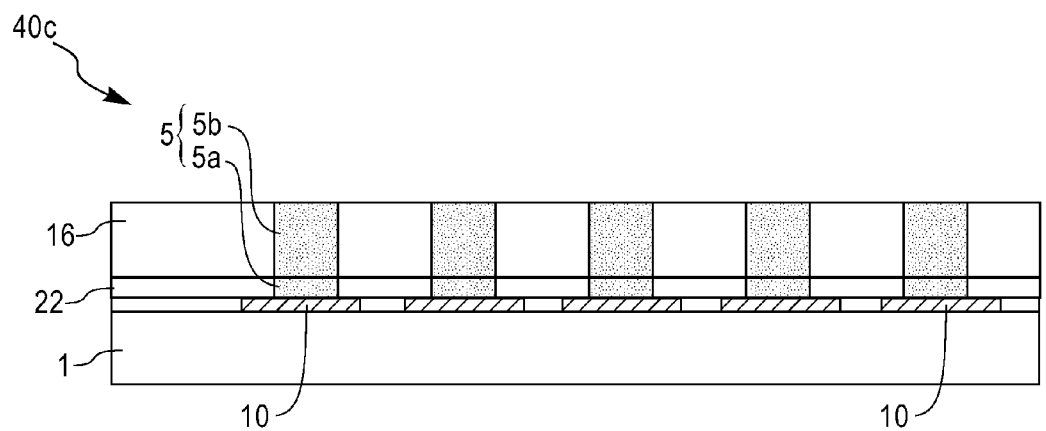

FIG. 8E illustrates a cross sectional view of a structure 40C formed after a thermo-compression bonding process and a removal of sacrificial carrier substrate 35 layer a release layer 36 process has been performed, in accordance with embodiments of the present invention. The transfer process comprises heating the aligned assembly (i.e., from FIG. 8D) to a temperature of between about 200 Celsius (C) to about 400 C. The heating process is performed at an inert atmosphere comprising a pressure of 10-100 psi for 5 to 60 minutes. Optional layer of adhesive 22 may be used to enhance a mechanical stability of structure 40C. After the thermo-compression bonding process has been completed, sacrificial carrier substrate 35 may be removed by laser ablation of release layer 36 or by mechanical grinding and etching. Structure 40C is aligned over substrate 4 (i.e., of FIG. 1 or 2) and bonded to substrate 4 in order to form structure 2a of FIG. 1 or structure 2b of FIG. 2.

FIGS. 9A-9F illustrate a process for generating electrical structure 2E-2H of FIGS. 5A-6B, in accordance with embodiments of the present invention.

Figure 9A:
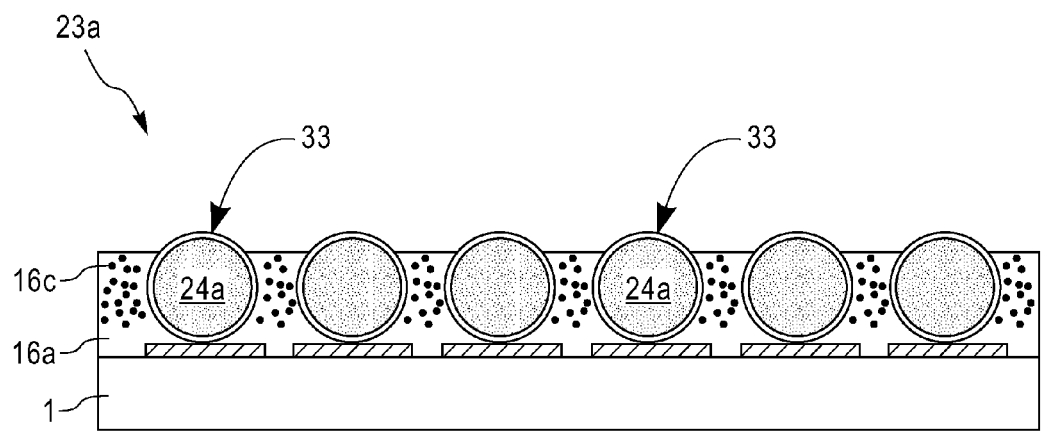
FIGS. 9A-9F illustrate a process for generating the electrical structure of FIGS. 5A-6B, in accordance with embodiments of the present invention.

FIG. 9A illustrates a cross sectional view of structure 23b that is similar to structure 23a of FIG. 7E after underfill layer 16a has been formed, in accordance with embodiments of the present invention. Underfill layer 16a may be applied at wafer-level or on singulated devices. Wafer level underfill may contain a filler 16c for low coefficient of thermal expansion (CTE). As an alternative, each of non-solder metallic core structures 24a could comprise associated solder structures 5a formed over a portion 33 of non-solder metallic core structures 24a. The aforementioned solder structures 5a would be used to form structure 2F of FIG. 5B and structure 2H of FIG. 6B.

Figure 9B:
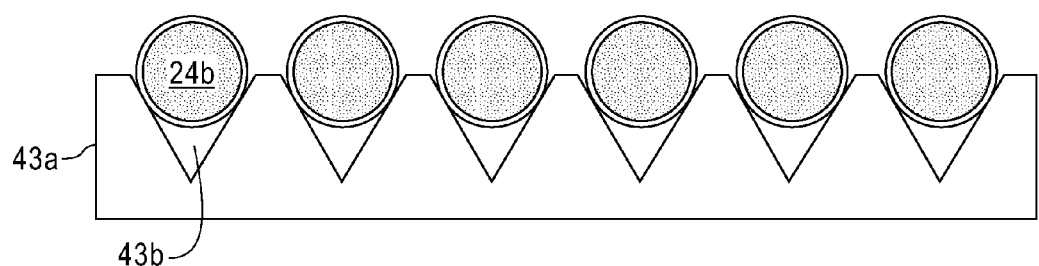

FIG. 9B illustrates a cross sectional view of a transfer substrate 43a comprising a plurality of non-solder metallic core structures 24b, in accordance with embodiments of the present invention. Non-solder metallic core structures 24b are positioned in cavities 43b within transfer substrate 43a. Each of cavities 43b comprises similar dimensions as non-solder metallic core structures 24b with cavity positions corresponding to positions of associated non-solder metallic core structures 24a (i.e., from FIG. 9A). Transfer substrate 43a may comprise, inter alia, glass, silicon, etc. Non-solder metallic core structures 24b may be dispensed into cavities 43b as a slurry in a solvent such as, inter alia, water alcohol (e.g., isopropanol), etc. The solvent may comprise an appropriate amount of flux (i.e., if generating structure 2F of FIG. 5B or FIG. 2H of FIG. 6B) to assist in the wetting of solder structures 5a (of FIGS. 5B and 6B) to non-solder metallic core structures 24a. In a case in which non-solder metallic core structures 17 are coated with a gold layer, flux is not necessary. Optionally, the solvent may additionally comprise a small amount of thermally degradable polymeric adhesive to aid in retaining non-solder metallic core structures 24b in cavities 43b. Cavities 43b are fabricated to a size that will only cause one non-solder metallic core structure 24b to fall into it during a dispensing of non-solder metallic core structures 24b.

Figure 9C:
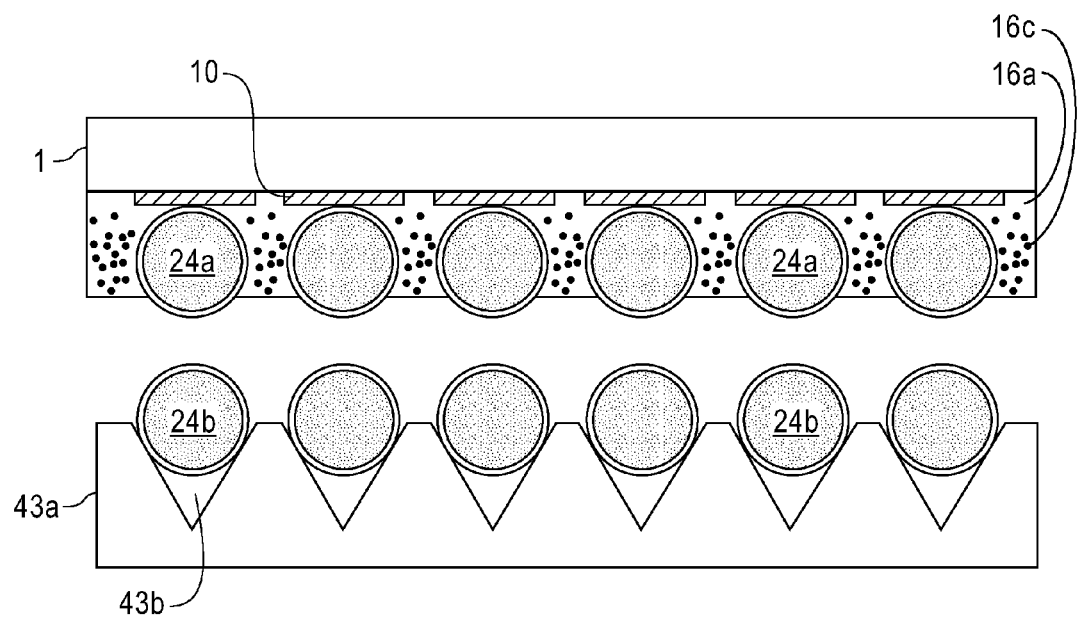

FIG. 9C illustrates a cross sectional view of a structure 23a of FIG. 11A positioned over transfer substrate 43a comprising non-solder metallic core structures 24a, in accordance with embodiments of the present invention. Structure 23a of FIG. 11A is positioned over transfer substrate 43a comprising non-solder metallic core structures 24b in order to transfer and connect non-solder metallic core structures 24a to non-solder metallic core structures 24b. Non-solder metallic core structures 24a are thermo-compression bonded to non-solder metallic core structures 24b to form structure 2E of FIG. 5A and structure 2G of FIG. 6A. As an alternative, each of non-solder metallic core structures 24a could comprise associated solder structures 5a formed over a portion 33 of non-solder metallic core structures 24a. The aforementioned solder structures 5a would be used connect non-solder metallic core structures 24a to non-solder metallic core structures 24b in order to form structure 2F of FIG. 5B and structure 2H of FIG. 6B.

Figure 9D:
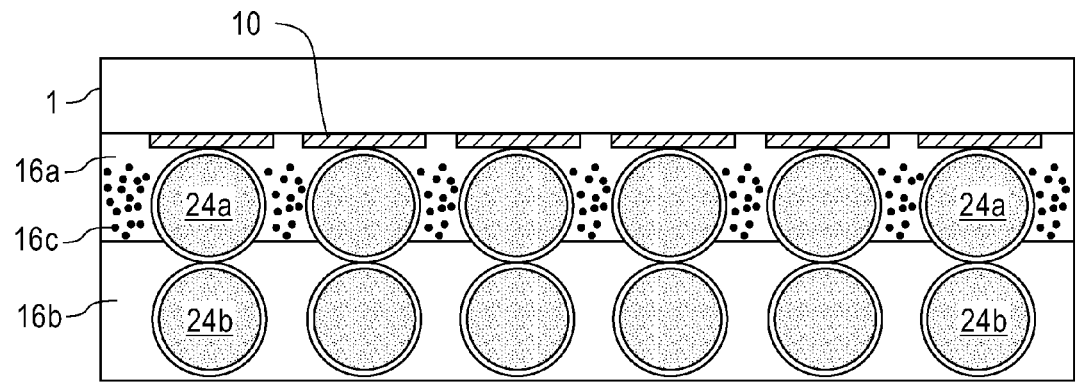

FIG. 9D illustrates a cross sectional view of structure 23a of FIG. 11A after non-solder metallic core structures 24b have been connected to non-solder metallic core structures 24a, in accordance with embodiments of the present invention. FIG. 9D illustrates a thermo-compression bond between non-solder metallic core structures 24b and non-solder metallic core structures 24a. Alternatively, each of non-solder metallic core structures 24a could comprise associated solder structures 5a to connect non-solder metallic core structures 24a to non-solder metallic core structures 24b.

Figure 9E:
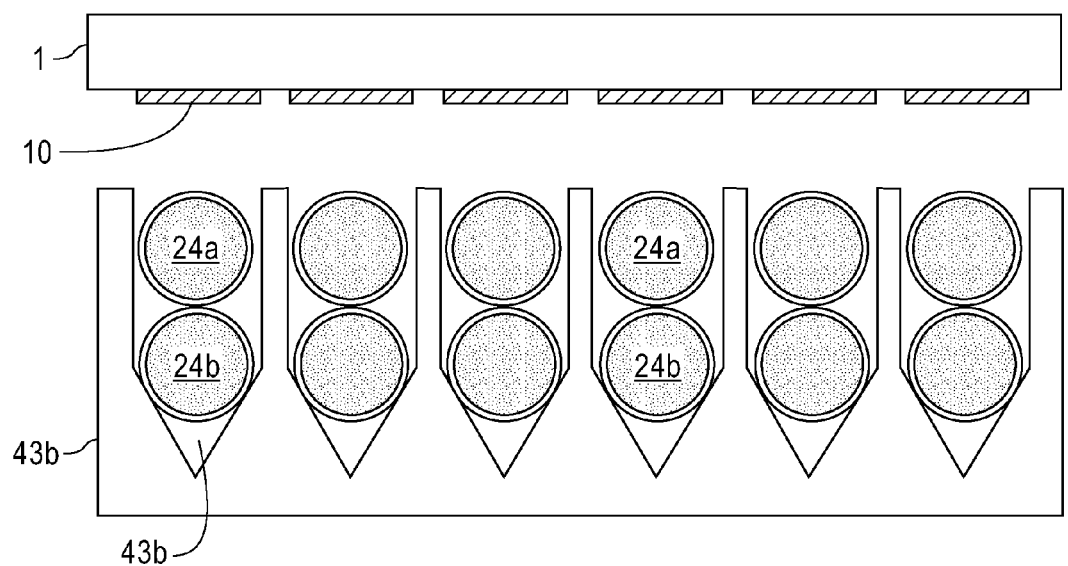

FIG. 9E depicts an alternative to FIG. 9B illustrating a cross sectional view of a transfer substrate 43b comprising non-solder metallic core structures 24a and non-solder metallic core structures 24b, in accordance with embodiments of the present invention. Non-solder metallic core structures 24a have been thermo-compression bonded to and non-solder metallic core structures 24b. Substrate 1 has been positioned over transfer substrate 43b comprising non-solder metallic core structures 24a and 24b so that non-solder metallic core structures 24a may be thermo-compression bonded to electrically conductive pads 10 with the resulting structure 23c illustrated in FIG. 9F.

Figure 9F:
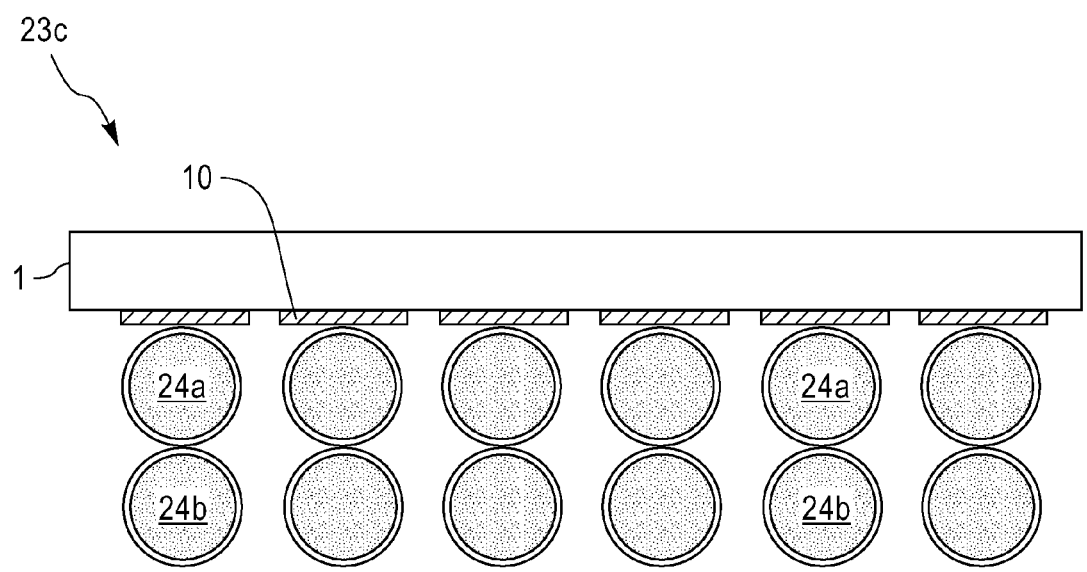

FIG. 9F depicts structure 23c resulting from the process described with reference to FIG. 9E, in accordance with embodiments of the present invention.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure comprising:
    a first substrate comprising a first electrically conductive pad;
    a second substrate comprising a second electrically conductive pad; and
    an interconnect structure electrically and mechanically connecting said first electrically conductive pad to said second electrically conductive pad, wherein said interconnect structure comprises a non-solder metallic core structure and a first solder structure in direct mechanical contact with a first portion of said non-solder metallic core structure, wherein said first solder structure electrically and mechanically connects said first portion of said non-solder metallic core structure to said first electrically conductive pad, wherein a second portion of said non-solder metallic core structure is thermo-compression bonded to said second electrically conductive pad, wherein said interconnect structure comprises a second solder structure, wherein said non-solder metallic core structure comprises a first non-solder metallic core comprising a spherical shape and a second non-solder metallic core comprising said spherical shape, wherein said second solder structure electrically and mechanically attaches said first non-solder metallic core to said second non-solder metallic core, wherein said first portion of said non-solder metallic core structure is located on said first non-solder metallic core, and wherein said second portion of said non-solder metallic core structure is located on said second non-solder metallic core.

2. The electrical structure of claim 1, wherein said non-solder metallic core structure comprises a cylindrical shape.

3. The electrical structure of claim 1, wherein said non-solder metallic core structure comprises a spherical shape.

4. The electrical structure of claim 1, wherein said non-solder metallic core structure comprises a metallic material selected from the group consisting of copper, nickel, and gold.

5. The electrical structure of claim 1, wherein said first non-solder metallic core comprises a first metallic structure and a second metallic structure covering and in direct mechanical contact with an entire exterior surface of said first metallic structure, wherein said second metallic structure completely surrounds said first metallic structure, wherein said first metallic structure comprises a first metallic material, wherein said second metallic structure comprises a second metallic material that differs from the first metallic material, wherein said first portion of said non-solder metallic core structure is located on said second metallic structure, wherein said second non-solder metallic core comprises a third metallic structure and a fourth metallic structure covering and in direct mechanical contact with an entire exterior surface of said third metallic structure, wherein said fourth metallic structure completely surrounds said third metallic structure, wherein said third metallic structure comprises said first metallic material, wherein said fourth metallic structure comprises said second metallic material, and wherein said second portion of said non-solder metallic core structure is located on said fourth metallic structure.

6. The electrical structure of claim 1, wherein said first solder structure comprises a first solder material, wherein said second solder structure comprises a second solder material, and wherein said first solder material differs from said second solder material.

7. The electrical structure of claim 1, further comprising:
    a first layer of underfill encapsulant surrounding said first non-solder metallic core and in contact with said first substrate; and
    a second layer of underfill encapsulant surrounding said second non-solder metallic core and in contact with said second substrate, wherein said first layer comprises a first coefficient of thermal expansion, wherein said second layer comprises a second coefficient of thermal expansion, and wherein said first coefficient of thermal expansion differs from said second coefficient of thermal expansion.

8. The electrical structure of claim 7, wherein said first substrate is a chip carrier, wherein said second substrate is a semiconductor device.

9. The electrical structure of claim 1, further comprising:
    a solder interconnect structure consisting of solder, wherein said first substrate comprises a third electrically conductive pad, wherein said second substrate comprises a fourth electrically conductive pad, and wherein said solder interconnect structure electrically and mechanically connects said third electrically conductive pad to said fourth electrically conductive pad.

10. The electrical structure of claim 1, further comprising:
    a first layer of wafer level underfill encapsulant surrounding said interconnect structure and filling a space between said first substrate and said second substrate.

11. An electrical structure comprising:
    a first substrate comprising a first electrically conductive pad;
    a second substrate comprising a second electrically conductive pad; and
    an interconnect structure electrically and mechanically connecting said first electrically conductive pad to said second electrically conductive pad, wherein said interconnect structure comprises a non-solder metallic core structure and a first solder structure in direct mechanical contact with a first portion of said non-solder metallic core structure, wherein said first solder structure electrically and mechanically connects said first portion of said non-solder metallic core structure to said first electrically conductive pad, wherein a second portion of said non-solder metallic core structure is thermo-compression bonded to said second electrically conductive pad, wherein said non-solder metallic core structure comprises a first non-solder metallic core comprising a spherical shape and a second non-solder metallic core comprising said spherical shape, wherein a first non-solder metallic core is thermo-compression bonded to said second non-solder metallic core, wherein said first portion of said non-solder metallic core structure is located on said first non-solder metallic core, and wherein said second portion of said non-solder metallic core structure is located on said second non-solder metallic core.

12. The electrical structure of claim 1, wherein said first non-solder metallic core comprises gold, and wherein said second non-solder metallic core comprises copper.

13. The electrical structure of claim 1, further comprising:
a first layer of underfill encapsulant surrounding said first non-solder metallic core and in contact with said first substrate; and
a second layer of underfill encapsulant surrounding said second non-solder metallic core and in contact with said second substrate, wherein said first layer comprises a first coefficient of thermal expansion, wherein said second layer comprises a second coefficient of thermal expansion, and wherein said first coefficient of thermal expansion differs from said second coefficient of thermal expansion.

14. The electrical structure of claim 1, further comprising:
a solder interconnect structure consisting of solder, wherein said first substrate comprises a third electrically conductive pad, wherein said second substrate comprises a fourth electrically conductive pad, and wherein said solder interconnect structure electrically and mechanically connects said third electrically conductive pad to said fourth electrically conductive pad.

15. The electrical structure of claim 1, wherein said first electrically conductive pad is formed within said first substrate, wherein said first electrically conductive pad comprises a first material layer formed over and in contact with a second material layer, wherein said first material layer comprises a different material from said second material layer, wherein said second electrically conductive pad is formed within said second substrate, wherein said second electrically conductive pad comprises a third material layer formed over and in contact with a fourth material layer, and wherein said third material layer comprises a different material from said fourth material layer.

16. The electrical structure of claim 15, wherein said first material layer comprises a same material as said non-solder metallic core structure.

17. The electrical structure of claim 15, wherein said third material layer comprises a same material as said non-solder metallic core structure.

\* \* \* \* \*